United States Patent [19]
Yang

[11] Patent Number: 5,459,086
[45] Date of Patent: Oct. 17, 1995

[54] METAL VIA SIDEWALL TILT ANGLE IMPLANT FOR SOG

[75] Inventor: Ming-Tzong Yang, Hsin Chu, Taiwan

[73] Assignee: United Microelectronics Corporation, Hsinchu, Taiwan

[21] Appl. No.: 334,953

[22] Filed: Nov. 7, 1994

[51] Int. Cl.$^6$ .................. H01L 21/469; H01L 21/265
[52] U.S. Cl. ................... 437/35; 437/231; 437/240; 437/978; 437/195
[58] Field of Search ................. 437/35, 231, 240, 437/978, 195, 238, 24; 257/637

[56] References Cited

U.S. PATENT DOCUMENTS

| | | | |
|---|---|---|---|
| 4,208,780 | 6/1980 | Richman | 437/35 |
| 5,003,062 | 3/1991 | Yen | 437/231 |
| 5,158,904 | 10/1992 | Ueda | 437/45 |
| 5,177,588 | 1/1993 | Ii et al. | 437/241 |
| 5,192,697 | 3/1993 | Leong | 437/37 |
| 5,219,792 | 6/1993 | Kim et al. | 437/195 |
| 5,252,515 | 10/1993 | Tsai et al. | 437/195 |
| 5,254,497 | 10/1993 | Liu | 437/978 |
| 5,286,677 | 2/1994 | Wu | 437/195 |
| 5,334,554 | 8/1994 | Lin et al. | 437/231 |
| 5,364,804 | 11/1994 | Ho et al. | 437/978 |
| 5,387,529 | 2/1995 | Oku | 437/240 |

OTHER PUBLICATIONS

"Modification Effects in Ion–Implanted SiO$_2$ Spin–on–Glass" by N. Moriya, Y. Shacham–Diamond, and R. Kalish, J. Electrochem Soc. vol. 140, No. 5, May 1993, pp. 1442–1449.

Primary Examiner—Olik Chaudhuri
Assistant Examiner—S. Mulpuri
Attorney, Agent, or Firm—George O. Saile

[57] ABSTRACT

A new method of forming the dielectric layer of an integrated circuit is described. A thick insulating layer is formed over semiconductor device structures in and on a semiconductor substrate. A first metal layer is deposited over the thick insulating layer. The first metal layer is etched using conventional photolithography and etching techniques to form the desired metal pattern on the surface of the thick insulating layer. The intermetal dielectric layer is formed by first covering the patterned first metal layer with a layer of silicon oxide. The silicon oxide layer is covered with a layer of spin-on-glass material which is baked and cured. A second layer of silicon oxide completes the intermetal dielectric layer. Via openings are formed through the intermetal dielectric layer to the underlying patterned first metal layer. A large tilt-angle implant is made into the sidewalls of the via openings to transform the exposed spin-on-glass layer so that it will not absorb moisture from the atmosphere thereby preventing outgassing from the intermetal dielectric layer, and thus preventing poisoned via metallurgy. A second metal layer is deposited overlying the intermetal dielectric layer and within the via openings and fabrication of the integrated circuit is completed.

25 Claims, 2 Drawing Sheets

METAL VIA SIDEWALL TILT ANGLE IMPLANT FOR SOG

RELATED PATENT APPLICATION

U.S. Pat. No. 5,393,702 "Via Sidewall SOG Nitridation by RTP and Furnace for Via Filling" by M. T. Yang et al.

BACKGROUND OF THE INVENTION (1) Field of the Invention

The invention relates to a method of metal via formation, and more particularly, to a method of forming a spin-on-glass intermetal dielectric layer using large tilt angle ion implantation to prevent poisoned via metallurgy in the fabrication of integrated circuits.

(2) Description of the Prior Art

The spin-on-glass materials have been used for planarization of integrated circuits. The material to be applied is thoroughly mixed in a suitable solvent. The spin-on-glass material suspended in the vehicle or solvent is deposited onto the semiconductor wafer surface and uniformly spread thereover by the action of spinning the wafer. The material fills the indentations in the integrated circuit wafer surface; that is planarization. Most of the vehicle or solvent is driven off by a low temperature baking step often followed by vacuum degassing. Other coatings of the spin-on-glass material are applied, baked and vacuum degassed until the desired spin-on-glass layer is formed.

The final step in the making of the spin-on-glass layer is curing. Curing is a high temperature heating step to cause the breakdown of the silicate or siloxane material to a silicon dioxide like cross linked material. A cured spin-on-glass process is described in U.S. Pat. No. 5,003,062 to Yen.

In the conventional etchback process as taught by Yen U.S. Pat. No. 5,003,062, the spin-on-glass layer is etched back resulting in a poisoned via metallurgy, such as aluminum, caused by outgassing. Referring to FIG. 1, there is shown a partially completed integrated circuit in which gate electrodes 12 have been formed on a silicon substrate 10. A first insulating layer 14 is deposited over the gate electrodes 12. A first metal layer 16, typically aluminum or an aluminum alloy, is deposited and patterned. Then the intermetal dielectric layer is formed, consisting of a spin-on-glass layer 20 sandwiched between, for example, silicon dioxide layers 18 and 22. When a via opening 24 is made through the intermetal dielectric layer, leaving a portion of the spin-on-glass exposed, there may be outgassing of water from the spin-on-glass layer. This water reacts with the aluminum causing corrosion of the aluminum. When etchback is not used, poisoned via metallurgy occurs especially in small via sizes.

U.S. Pat. No. 5,219,792 to Kim et al teaches covering the spin-on-glass edge within the via opening with a silicon oxide layer to prevent outgassing. In U.S. Pat. No. 5,393,702 to the same inventor, a process is described for forming a silicon nitride cap on a spin-on-glass layer within a via opening to prevent outgassing.

In their paper, "Modification Effects in Ion-Implanted SiO2 Spin-on-Glass," by N. Moriya, Y. Shacham-Diamond, and R. Kalish, J. Electrochem Soc., Vol. 140, No. 5, May 1993, pp. 1442–1449, the authors disclose an ion implantation process to modify the spin-on-glass layer. There is no concept of how to overcome the poisoned via problem mentioned in this article. A major disadvantage of this process is that thick portions of the spin-on-glass layer cannot be affected in depth by the ion implantation. If a via opening is made where the spin-on-glass layer is thick, the poisoned via problem will still exist.

SUMMARY OF THE INVENTION

A principal object of the present invention is to provide an effective and very manufacturable method of forming the intermetal dielectric layer of an integrated circuit.

Another object of the present invention is to provide a method of forming the intermetal dielectric layer of an integrated circuit which does not result in poisoned via metallurgy.

Yet another object of the invention is to use a large tilt angle ion implantation to prevent outgassing from a spin-on-glass layer.

A further object of the invention is to prevent poisoned via metallurgy in via openings through both thick and thin spin-on-glass layers.

In accordance with the objects of this invention a new method of forming the dielectric layer of an integrated circuit is achieved. A thick insulating layer is formed over semiconductor device structures in and on a semiconductor substrate. A first metal layer is deposited over the thick insulating layer. The first metal layer is etched using conventional photolithography and etching techniques to form the desired metal pattern on the surface of the thick insulating layer. The intermetal dielectric layer is formed by first covering the patterned first metal layer with a layer of silicon oxide. The silicon oxide layer is covered with a layer of spin-on-glass material which is baked and cured. A second layer of silicon oxide completes the intermetal dielectric layer. Via openings are formed through the intermetal dielectric layer to the underlying patterned first metal layer. A large tilt-angle implant is made into the sidewalls of the via openings to transform the exposed spin-on-glass layer so that it will not absorb moisture from the atmosphere thereby preventing outgassing from the intermetal dielectric layer, and thus preventing poisoned via metallurgy. A second metal layer is deposited overlying the intermetal dielectric layer and within the via openings and fabrication of the integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
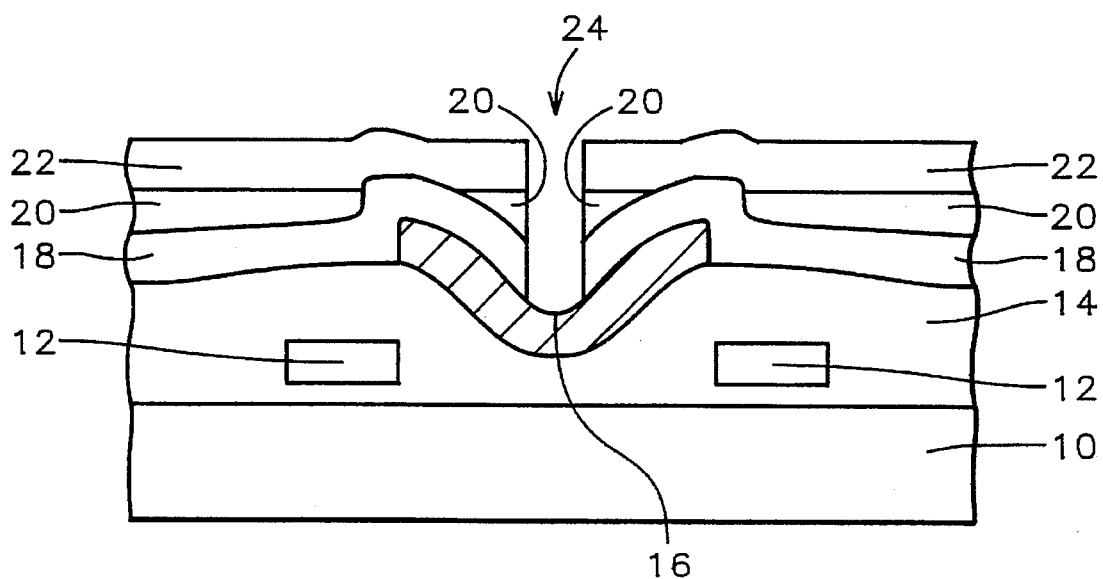
FIG. 1 schematically illustrates in cross-sectional representation an embodiment of the prior art.
Figure 2:
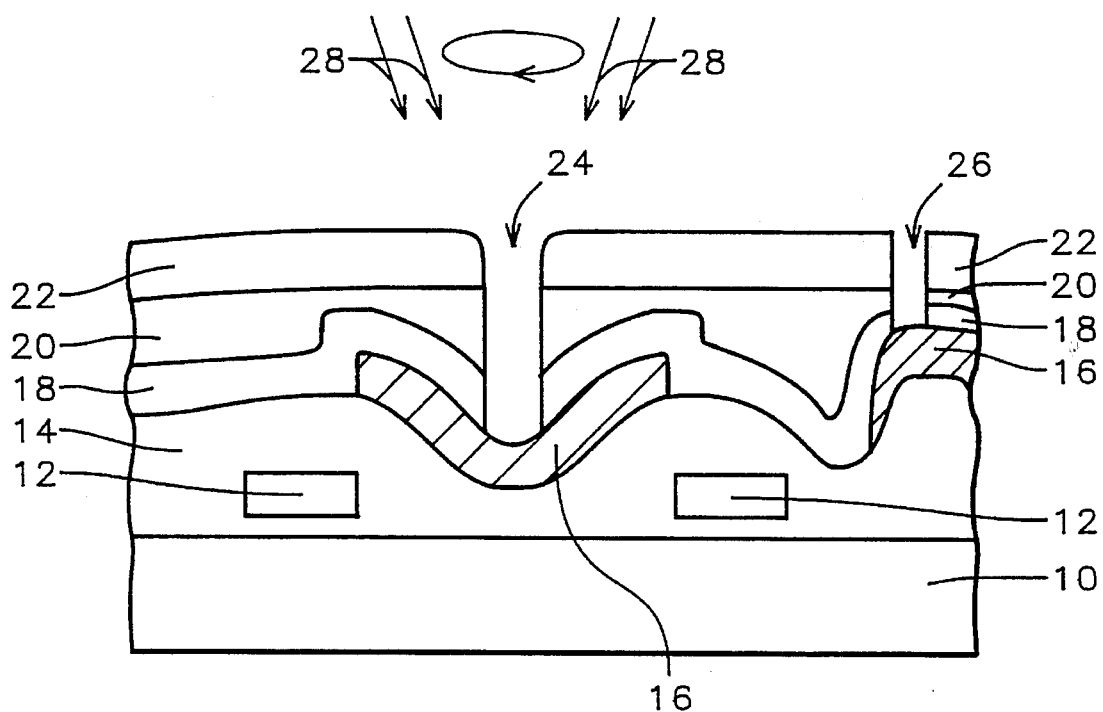
FIGS. 2 and 3 schematically illustrate in cross-sectional representation one preferred embodiment of the present invention.

Referring now more particularly to FIG. 2, there is shown a portion of a partially completed integrated circuit. The semiconductor substrate 10 is preferably composed of monocrystalline silicon. A layer of polysilicon is deposited and patterned using photolithography and etching techniques to form gate electrode patterns 12. A thick passivation or insulating layer 14 is then formed over the surfaces of the patterns. This layer may be composed of borophosphosilicate glass, phosphosilicate glass or similar insulating layer. The operational thickness of the insulating layer is between about 2000 to 10,000 Angstroms.

A metal 16 is sputter deposited over the surface of the insulating layer 14. This metal may be aluminum or an aluminum alloy. The metal layer is patterned using conventional photolithography and etching techniques to form the metal pattern shown in FIG. 2. A conformal layer of silicon oxide 18 is deposited using plasma enhanced chemical vapor deposition (PECVD) to a thickness of between about 1000 to 6000 Angstroms. A tetraethoxysilane (TEOS) oxide or other silane-based oxide may be used. This is the first layer of the intermetal dielectric sandwich layer.

Now a silicate or siloxane spin-on-glass coating 20 is applied. The spin-on-glass material suspended in the vehicle or solvent is deposited onto the semiconductor wafer surface and uniformly spread thereover by the action of spinning the wafer. The material fills the indentations in the integrated circuit wafer surface; that is planarization. Most of the vehicle or solvent is driven off by a low temperature baking step. A double or triple coating of spin-on-glass could be used if desired. The preferred thickness of the spin-on-glass layer is between about 500 to 15,000 Angstroms. The spin-on-glass layer is cured at between about 350° to 550° C. for between 5 to 300 minutes.

Finally, the top layer of the spin-on-glass sandwich is deposited. A second layer 22 of silicon oxide is deposited by PECVD to a thickness of between about 500 to 10,000 Angstroms. Via openings 24 and 26 are made through the dielectric layer to the underlying first metal layer.

The present invention overcomes the poisoned via problem by using a large tilt angle ion implantation 28, illustrated in FIG. 2. Ions such as $B_{11}^+$, $F_{19}^+$, $P_{31}^+$, $As^+$, $Si^+$, and $N^+$ or a double charge of these ions are implanted into the layers 18, 20, and 22 where they are exposed within the via openings 24 and 26. A dosage of between about 1 E 13 to 5 E 16 atoms/cm$^2$ at an energy of between about 20 to 500 KeV and a tilt angle of between about 3 to 75° is used. A tilt angle of more than about 20° is preferred to provide the full ion implant treatment to the spin-on-glass layer especially within narrow via openings. The wafer is rotated at between about 0.1 to 10 rotations per second for between about 1 to 100 seconds for a symmetrical ion implantation.

The result of the ion implantation on the spin-on-glass layer 20 is to change the structure of the spin-on-glass material to be close to the structure of silicon dioxide. Since silicon dioxide does not absorb moisture from the atmosphere, this change in the spin-on-glass material prevents the spin-on-glass layer 20 exposed within the via openings from absorbing moisture and thus prevents outgassing of moisture into the metal layer filling the via openings. The process of the invention works for via openings made through both thick spin-on-glass layers, such as 24, and through thin spin-on-glass layers, such as 26.

Figure 3:
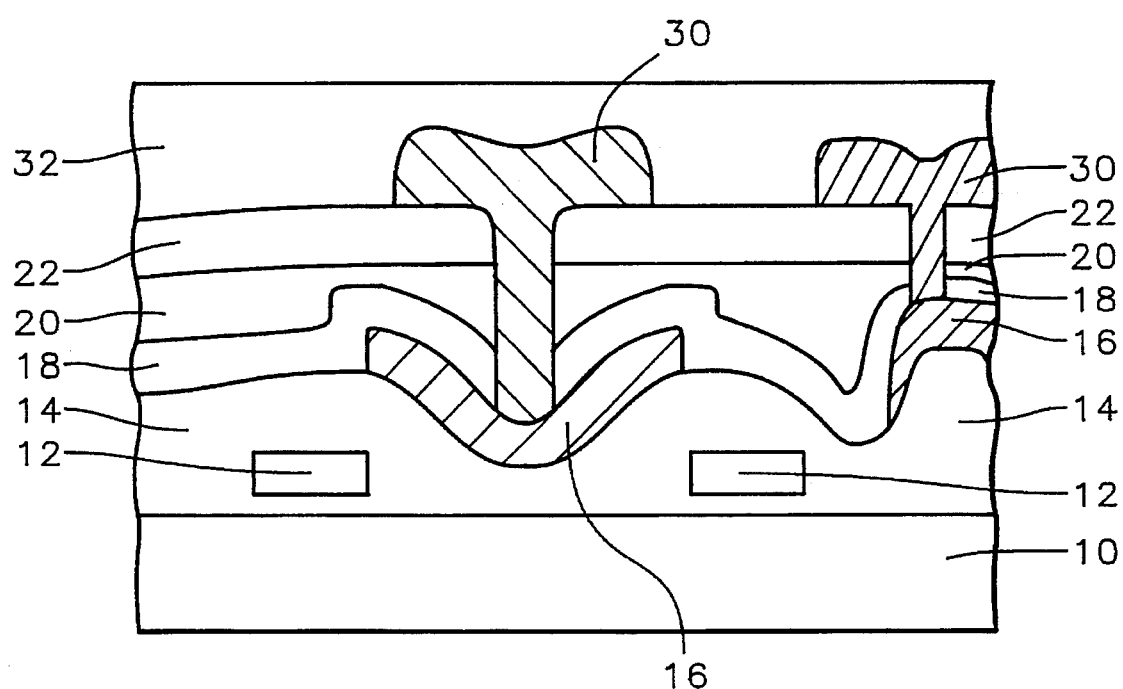

Referring now to FIG. 3, the second metallurgy 30 is sputter deposited over the surface of the wafer and within the via openings to make contact with the first metal layer 16. Since moisture is not absorbed by the transformed spin-on-glass layer 20, there is no outgassing of water from the spin-on-glass layer.

While the invention has been particularly shown and described with reference to the preferred embodiments thereof, it will be understood by those skilled in the art that various changes in form and details may be made without departing from the spirit and scope of the invention.

What is claimed is:

1. The method of forming the intermetal dielectric layer of an integrated circuit while preventing outgassing from said intermetal dielectric layer comprising:

depositing a layer of polysilicon over the surface of a semiconductor substrate;

etching said polysilicon layer using photolithography and etching techniques to form a pattern of gate electrodes on the surface of said semiconductor substrate;

covering said pattern of gate electrodes with an insulating layer;

depositing a first metal layer over said insulating layer;

etching said first metal layer using photolithography and etching techniques to form a metal pattern on the surface of said insulating layer;

forming said intermetal dielectric layer comprising:

covering said patterned first metal layer with a first layer of silicon oxide;

covering said first silicon oxide layer with a layer of spin-on-glass material, and baking and curing said spin-on-glass layer to form a spin-on-glass silicon oxide layer; and covering said spin-on-glass silicon oxide layer with a second layer of silicon oxide to complete said intermetal dielectric layer;

forming via openings through said intermetal dielectric layer to underlying said patterned first metal layer which thereby exposes portions of said spin-on-glass silicon oxide within said via openings;

implanting ions at a tilt angle into said exposed portions of said spin-on-glass silicon oxide within said via openings wherein said ion implantation transforms said spin-on-glass silicon oxide within said via openings to a silicon dioxide type material which will not absorb moisture from the atmosphere thereby preventing said outgassing from said intermetal dielectric layer;

depositing a second metal layer overlying said intermetal dielectric layer and within said via openings; and completing fabrication of said integrated circuit.

2. The method of claim 1 wherein said insulating layer is composed of borophosphosilicate glass.

3. The method of claim 1 wherein said first and second silicon oxide layers are deposited by plasma enhanced chemical vapor deposition to a thickness of between about 1000 to 8000 Angstroms.

4. The method of claim 1 wherein said spin-on-glass material has a preferred thickness of between about 500 to 15,000 Angstroms.

5. The method of claim 1 wherein said ions are implanted with a dosage of between about 1 E 13 to 5 E 16 atoms/cm$^2$ and an energy of between about 20 to 500 KeV at the tilt angle of more than about 20°.

6. The method of claim 1 wherein said ions are boron ions.

7. The method of claim 1 wherein said ions are fluoride ions.

8. The method of claim 1 wherein said ions are phosphorus ions.

9. The method of claim 1 wherein said ion implantation is performed while the wafer containing said semiconductor substrate is rotated at 0.1 to 10 rotations per second for between about 1 to 100 seconds for a symmetrical implantation.

10. The method of forming the intermetal dielectric layer of an integrated circuit while preventing outgassing from said intermetal dielectric layer comprising:

providing an insulating layer over semiconductor device structures in and on a semiconductor substrate;

depositing a first metal layer over said insulating layer;

etching said first metal layer using photolithography and etching techniques to form a metal pattern on the surface of said insulating layer;

forming said intermetal dielectric layer comprising:
  covering said patterned first metal layer with a first layer of silicon oxide;
  covering said first silicon oxide layer with a layer of spin-on-glass material and baking and curing said spin-on-glass layer to form a spin-on-glass silicon oxide layer; and
  covering said spin-on-glass layer with a second layer of silicon oxide to complete said intermetal dielectric layer;

forming via openings through said intermetal dielectric layer to underlying said patterned first metal layer;

implanting ions at a tilt angle into said exposed portions of said spin-on-glass silicon oxide within said via opening wherein said ion implantation transforms said spin-on-glass silicon oxide within said via openings to a silicon dioxide type material which will not absorb moisture from the atmosphere thereby preventing said outgassing from said intermetal dielectric layer;

depositing a second metal layer overlying said intermetal dielectric layer and within said via openings; and completing fabrication of said integrated circuit.

11. The method of claim 10 wherein said first and second silicon oxide layers are deposited by plasma enhanced chemical vapor deposition to a thickness of between about 1000 to 8000 Angstroms.

12. The method of claim 10 wherein said spin-on-glass material has a thickness of between about 500 to 15,000 Angstroms.

13. The method of claim 10 wherein said ions are implanted with a dosage of between about 1 E 13 to 5 E 16 atoms/cm$^2$ and an energy of between about 20 to 500 KeV at the tilt angle of more than about 20°.

14. The method of claim 10 wherein said ions are boron ions.

15. The method of claim 10 wherein said ions are fluoride ions.

16. The method of claim 10 wherein said ions are phosphorus ions.

17. The method of claim 10 wherein said ion implantation is performed while the wafer containing said semiconductor substrate is rotated at 0.1 to 10 rotations per second for between about 1 to 100 seconds for a symmetrical implantation.

18. The method of forming the intermetal dielectric layer of an integrated circuit while preventing outgassing from said intermetal dielectric layer comprising:

providing an insulating layer over semiconductor device structures in and on a semiconductor substrate;

depositing and patterning a first metal layer over said insulating layer;

forming said intermetal dielectric layer comprising:
  covering said patterned first metal layer with a first layer of silicon oxide;
  covering said first silicon oxide layer with a layer of spin-on-glass material and baking and curing said spin-on-glass layer to form a spin-on-glass silicon oxide layer; and
  covering said spin-on-glass layer with a second layer of silicon oxide to complete said intermetal dielectric layer;

forming via openings through said intermetal dielectric layer to underlying said patterned first metal layer wherein at least one of said via openings is of a first type which penetrates through a relatively thick portion of said spin-on-glass layer and wherein at least one of said via openings is of a second type which penetrates through a relatively thin portion of said spin-on-glass layer;

implanting ions at a tilt angle into said exposed portions of said spin-on-glass silicon oxide within said via openings wherein said ion implantation transforms said spin-on-glass silicon oxide within said via openings to a silicon dioxide type material which will not absorb moisture from the atmosphere thereby preventing said outgassing from said intermetal dielectric layer and wherein said ion implantation transformation succeeds both where said via openings are of said first type and where said via openings are of said second type;

depositing a second metal layer overlying said intermetal dielectric layer and within said via openings; and completing fabrication of said integrated circuit.

19. The method of claim 18 wherein said first and second silicon oxide layers are deposited by plasma enhanced chemical vapor deposition to a thickness of between about 1000 to 8000 Angstroms.

20. The method of claim 18 wherein said spin-on-glass material has a thickness of between about 500 to 15,000 Angstroms.

21. The method of claim 18 wherein said ions are implanted with a dosage of between about 1 E 13 to 5 E 16 atoms/cm$^2$ and an energy of between about 20 to 500 KeV at the tilt angle of more than about 20°.

22. The method of claim 18 wherein said ions are boron ions.

23. The method of claim 18 wherein said ions are fluoride ions.

24. The method of claim 18 wherein said ions are phosphorus ions.

25. The method of claim 18 wherein said ion implantation is performed while the wafer containing said semiconductor substrate is rotated at 0.1 to 10 rotations per second for between about 1 to 100 seconds for a symmetrical implantation.

* * * * *